(12) United States Patent
Heim et al.

(10) Patent No.: US 7,190,852 B2
(45) Date of Patent: Mar. 13, 2007

(54) SEMICONDUCTOR DEVICES WITH CURVED WAVEGUIDES AND MODE TRANSFORMERS

(75) Inventors: Peter J. S. Heim, Washington, DC (US); Mario Dagenais, Chevy Chase, MD (US); Simarjeet Saini, Columbia, MD (US)

(73) Assignee: Covega Corporation, Jessup, MD (US)

( * ) Notice: Subject to any disclaimer, the term of this patent is extended or adjusted under 35 U.S.C. 154(b) by 409 days.

(21) Appl. No.: 10/270,370

(22) Filed: Oct. 15, 2002

(65) Prior Publication Data

US 2004/0071384 A1 Apr. 15, 2004

(51) Int. Cl.
*G01C 3/14* (2006.01)
*G01P 3/36* (2006.01)
*G01J 5/48* (2006.01)

(52) U.S. Cl. .............................. 385/14; 385/28; 385/43
(58) Field of Classification Search .................. 385/14, 385/28, 27, 43, 39, 129
See application file for complete search history.

(56) References Cited

U.S. PATENT DOCUMENTS

| | | | |
|---|---|---|---|
| 5,278,926 A | | 1/1994 | Doussiere |
| 5,659,646 A | | 8/1997 | Vinchant et al. |
| 5,978,400 A | | 11/1999 | Campbell et al. |
| 5,982,531 A | | 11/1999 | Emery et al. |
| 6,118,803 A | | 9/2000 | Sanders et al. |
| 6,310,995 B1 | | 10/2001 | Saini et al. |
| 6,314,117 B1 | | 11/2001 | Heim et al. |
| 6,411,763 B1 | * | 6/2002 | Sillard et al. ............... 385/129 |
| 6,456,429 B1 | | 9/2002 | Wu |
| 6,600,847 B2 | * | 7/2003 | Saini et al. .................... 385/14 |
| 6,813,404 B2 | * | 11/2004 | Kato ............................ 385/14 |
| 6,819,814 B2 | * | 11/2004 | Forrest et al. ................ 385/14 |
| 6,856,709 B2 | * | 2/2005 | Uesaka et al. ................ 385/14 |
| 2004/0126063 A1 | * | 7/2004 | Alphonse ...................... 385/43 |
| 2005/0175045 A1 | * | 8/2005 | Paldus et al. ................. 372/20 |

OTHER PUBLICATIONS

Heim, Peter J.S. et al, "Single-Angled Facet Laser Diode for Tunable External Cavity Lasers", IEEE Princeton Section Sarnoff Symposium, Apr. 28, 1995.
Semenov, A.T. "Wide Spectrum Single Quantum Well Superluminescent Diodes at 0.8micrometers With Bent Optical Waveguide", Electronics Letters, vol. 29, No. 10, pp. 854-856, May 1993.
Heim, Peter J.S. et al, "Single-Angled-Facet Laser Diode For Widely Tunable External Cavity Semiconductor Lasers with High Spectral Purity", Electronics Letters, vol. 33, No. 16, pp. 1387-1389, Jul. 1997.

* cited by examiner

*Primary Examiner*—Jared J. Fureman
(74) *Attorney, Agent, or Firm*—Potomac Patent Group PLLC

(57) ABSTRACT

Semiconductor devices having various combinations of curved waveguides and mode transformers are described. According to some exemplary embodiments, the mode transformer itself can be fabricated as all or part of the curved waveguide. For these exemplary embodiments it can be beneficial to use mode transformers whose active regions are relatively small to minimize losses associated with the introduced curvature, e.g., mode transformers that employ resonantly coupled waveguides and a tapered active waveguide in the mode transformation region. According to other exemplary embodiments, the mode transformer can be disposed along a straight portion of the waveguide, e.g., between the curved portion of the waveguide and the back facet. The present invention also provides flexibility in manufacturing by permitting different types of devices to be generated from a wafer depending upon where the devices are cleaved.

21 Claims, 6 Drawing Sheets

SEMICONDUCTOR DEVICES WITH CURVED WAVEGUIDES AND MODE TRANSFORMERS

BACKGROUND

The present invention relates generally to semiconductor devices and methods of fabricating such devices and, more particularly, to semiconductor angled-facet laser devices (gain chips) having curved waveguides and mode transformers and methods of fabricating these devices.

Technologies associated with the communication of information have evolved rapidly over the last several decades. Over the last two decades, optical information communication technologies have evolved as the technology of choice for backbone information communication systems due to, among other things, their ability to provide large bandwidth, fast transmission speeds and high channel quality. Semiconductor laser devices are used in many aspects of optical communication systems, for example to generate optical carriers in optical transceivers and to generate optically amplified signals in optical amplifiers. In order to use laser devices in this capacity, they are coupled to the optical fibers over which the optical signals are carried.

There are various challenges that need to be addressed by the manufacturers of semiconductor laser devices in order to make these devices as efficient as possible for use in optical systems. For example, as seen in FIG. 1, an external cavity semiconductor laser comprises a semiconductor gain element 100 having front and back facets 102 and 104, respectively, with a waveguide 105 formed therebetween. A lens 106 (or other collimating optics) collimates the divergent optical output from waveguide 105 onto a diffraction grating 108. Diffracted light is then directed toward retroreflector 110, reflected back to diffraction grating 108 and, from there, back to front facet 102. This establishes a laser cavity between the retroreflector 110 and back facet 104. Optical energy is coupled outside the cavity from the semiconductor gain element 100 as shown by the dotted arrow in FIG. 1. Optical energy can also be extracted from the back facet through lens 112 as shown by the solid arrow in FIG. 1.

The high refractive index associated with the semiconductor material used to fabricate gain element 100 tends to cause reflections of the light from front facet 102 toward back facet 104. These reflections interfere with the primary lasing mode of the external lasing cavity and reduce the spectral quality of the laser emission. Initial attempts to reduce these undesirable reflections involved applying an anti-reflective coating to the front facet 102. However, these coatings are expensive and also are effective only in a relatively limited bandwidth. More recent innovations in reducing these unwanted reflections involve angling the facet 102 relative to the optical axis of propagation and providing a curved waveguide 105. These techniques are described, for example, in the article entitled "Single-angled-facet laser diode for widely tunable external cavity semiconductor lasers with high spectral purity", to P. J. S. Heim et al., *Electronics Letters*, July 1997, Vol. 33, No. 16, pp. 1387-1389, the disclosure of which is incorporated here by reference.

Another challenge faced by laser designers involves coupling the laser light generated by the laser of FIG. 1 to an optical fiber. Coupling of optical signals between a laser and an optical fiber results in coupling losses, which designers attempt to minimize in order to improve transmission and power efficiency. One cause of coupling losses is the different optical mode profiles (e.g., beam sizes and/or shapes) associated with lasers and optical fibers. Lasers typically have an elliptical mode profile whereas optical fibers typically have a circular mode profile that is also larger in dimension than the laser mode. Accordingly, it is desirable to transform the mode profile associated with the optical energy generated by the laser in the region where it is coupled to the optical fiber.

An example of a mode transformer for use in a semiconductor optical device is found in U.S. Pat. No. 5,278,926 to Pierre Doussiere, the disclosure of which is incorporated here by reference. Therein, the transverse cross-sectional area of an active waveguide decreases in a mode transition section to couple a narrow optical mode, which is generated and guided by the active waveguide, to a wide optical mode that is guided by a passive waveguide. However, the Doussiere patent describes a mode transformer employing active and passive waveguides having a linear geometry and is unconcerned with the implementation of a curved waveguide/mode transformer structure.

Accordingly, it would be desirable to provide semiconductor laser devices having curved waveguides and mode transformers that are optimized for implementation in curved waveguide devices, as well as efficient and cost effective methods of manufacturing such devices.

SUMMARY

Systems and methods according to the present invention address this need and others by providing semiconductor devices having various combinations of curved waveguides and mode transformers. According to some exemplary embodiments, the mode transformer itself can be fabricated as all or part of the curved waveguide. For these exemplary embodiments it is beneficial to use mode transformers whose active regions are relatively short to minimize losses associated with the introduced curvature, e.g., mode transformers that employ resonantly coupled waveguides and a tapered active waveguide in the mode transformation region. According to other exemplary embodiments, the mode transformer can be disposed along a straight portion of the waveguide, e.g., between the curved portion and the back facet. These embodiments also provide flexibility in manufacturing by permitting different types of devices to be generated from a wafer depending upon where the devices are cleaved.

For example, according to one exemplary embodiment, a semiconductor laser chip includes a front and back facet, a waveguide extending between the front and back facets, the waveguide having at least one curved portion and a mode transformer for transforming a mode of optical energy generated by the semiconductor gain section of the chip.

BRIEF DESCRIPTION OF THE DRAWINGS

The accompanying drawings illustrate exemplary embodiments of the present invention, wherein.

DETAILED DESCRIPTION

The following detailed description of the invention refers to the accompanying drawings. The same reference numbers in different drawings identify the same or similar elements. Also, the following detailed description does not limit the invention. Instead, the scope of the invention is defined by the appended claims.

Figure 1:
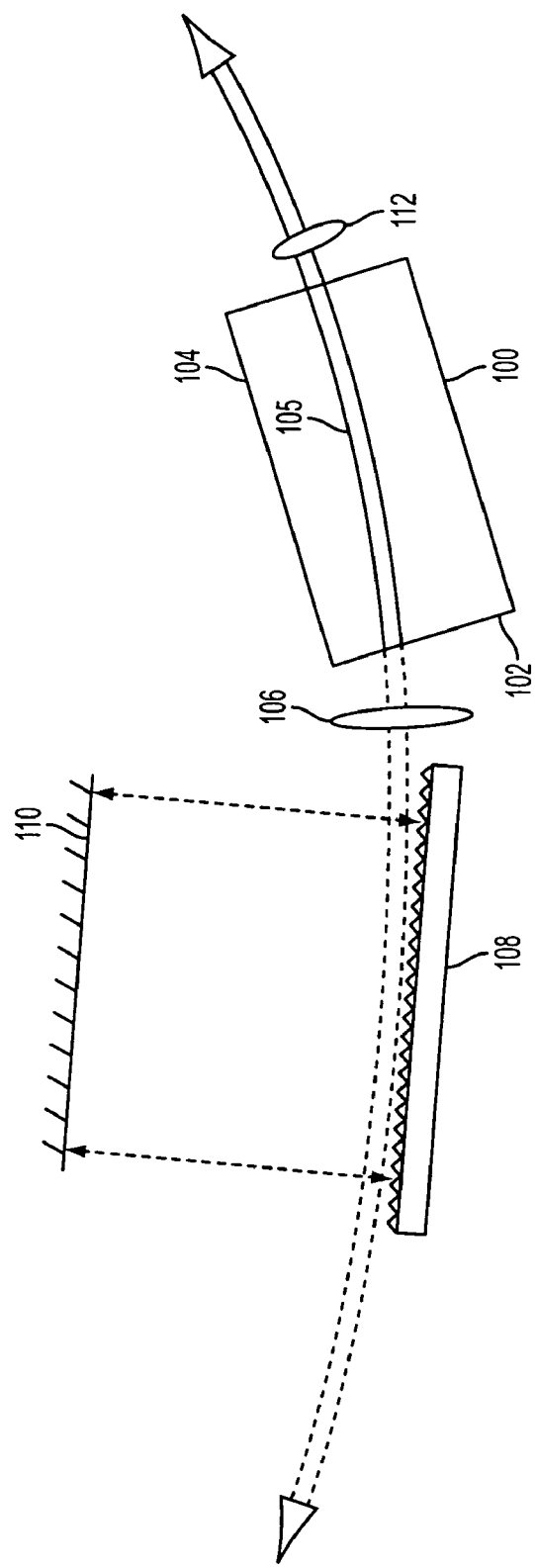
FIG. 1 depicts a conventional single angled-facet external cavity semiconductor laser having a curved waveguide.
Figure 2:
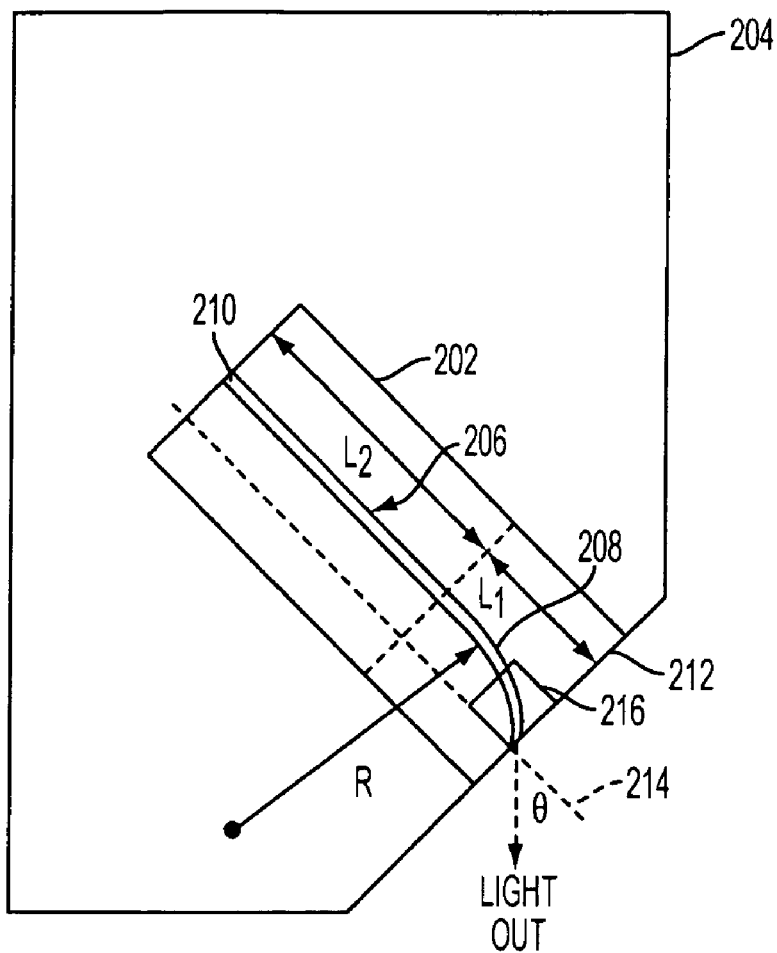
FIG. 2 illustrates an exemplary semiconductor package in which devices according to the present invention can be implemented.

Devices and methods according to exemplary embodiments of the present invention provide integrated semiconductor devices including gain chips with curved waveguides and mode transformers for use in single angled-facet (SAF) semiconductor laser devices, semiconductor optical amplifiers and other optical devices. As a starting point for discussing the various exemplary embodiments of the present invention, consider the exemplary gain chip illustrated as FIG. 2. Therein, a gain chip 202 has been attached (e.g., soldered) to a submount 204 which acts as a heat sink for the gain chip 202. Electrical connections to the gain chip 202 can be provided by bond wires or other means, which connections are not shown in FIG. 2. The semiconductor optical waveguide 206 has both a curved portion 208 and a straight portion 210. The curved portion 208 is, according to this exemplary embodiment, curved with a constant radius of curvature R given by $R=L_1/\sin(\theta)$ where $L_1$ is the length of the curved portion 208 and $\theta$ is the angle at which the curved portion 208 intersects the front facet 212 relative to a normal axis 214 associated with the front facet 212. Those skilled in the art will appreciate that other curving functions, e.g., sinusoidal or exponential, can be used to define the shape of the curved portion 208. The total chip length L is the sum of $L_1$ and $L_2$ where $L_2$ is the length of the straight waveguide 210. Those skilled in the art will appreciate that although both a curved portion 208 and a straight portion 210 are shown in the exemplary embodiment of FIG. 2, that the entire waveguide can be curved such that there is no straight portion ($L_2=0$).

As mentioned above, exemplary embodiments of the present invention also provide a mode transformer in tandem with the curved waveguide structure. As will be apparent from the following discussion of the exemplary embodiment of FIG. 2 and the exemplary embodiment of FIG. 4, such devices can be fabricated in different ways depending upon the desired characteristics, e.g., length, of the resulting gain chip 202. In particular, one or both of the location and type of mode transformer which is employed can vary based on, among other things, the length of the gain chip 202. According to a first exemplary embodiment, as depicted generically by block 216 in FIG. 2, a mode transformer 216 can be disposed within the gain chip 202 so as to be connected to, or form all or part of, the curved portion 208 of waveguide 206. Those skilled in the art will appreciate that there are numerous techniques that are known in the art for fabricating mode transformers per se, e.g., as described in U.S. Pat. Nos. 5,278,926 and 5,659,646, the disclosures of which are expressly incorporated here by reference, which techniques can be used to fabricate mode transformer 216 as all or part of the curved portion 208 of waveguide 206. However, Applicants have recognized that by introducing curvature to the mode transformer 216, the active regions thereof will experience greater losses than would be the case when employed in a mode transformer associated with a linear geometry. To minimize the losses associated with introducing curvature to the active regions of the mode transformer, Applicants have found that the use of a resonantly coupled mode transformer with a tapered active waveguide may be preferred for use as curved mode transformer 216 relative to other mode transformer implementations.

Figure 3:
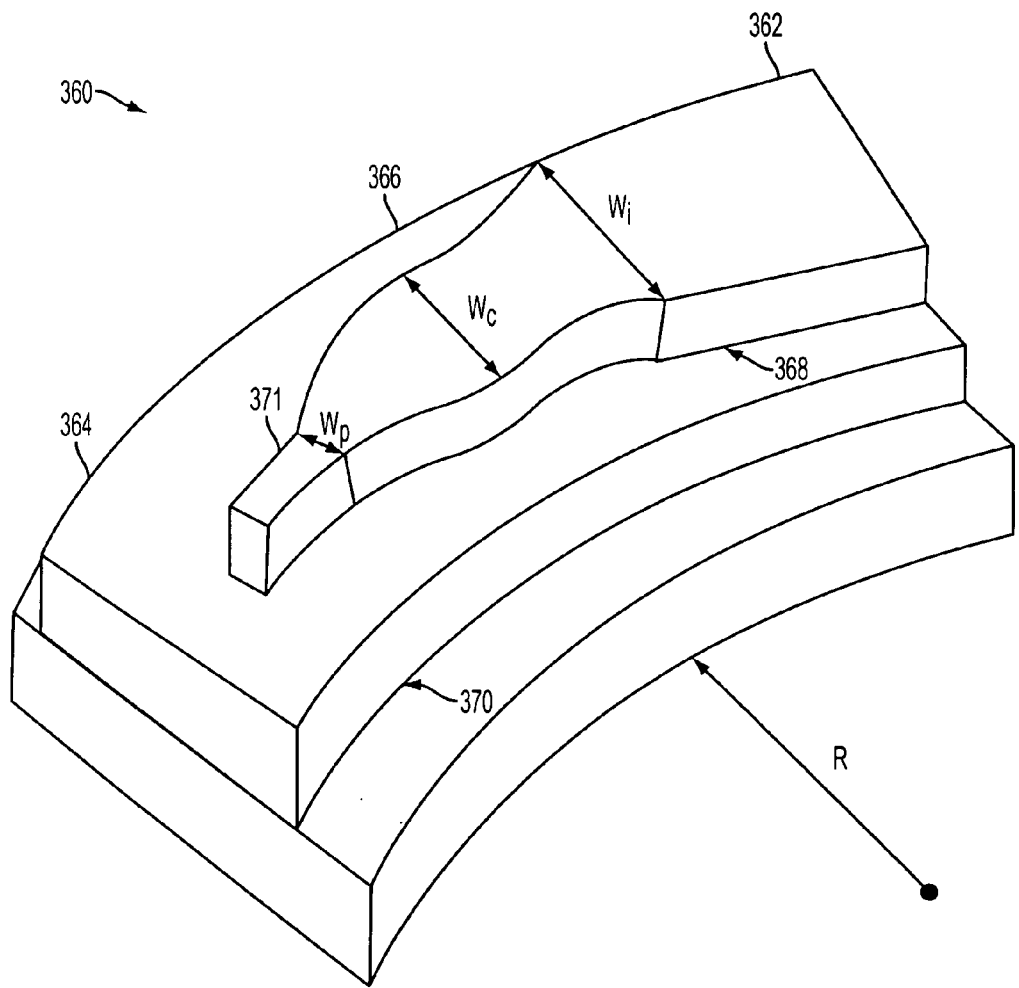
FIG. 3 depicts a curved mode transformer according to an exemplary embodiment of the present invention.

An example of a resonantly coupled mode transformer with a tapered active waveguide that can be adapted to function as all (or a portion of) the curved portion 208 of waveguide 206 can be found in U.S. Pat. No. 6,310,995, the disclosure of which is incorporated here by reference. This device can be adapted for use in a semiconductor package according to the present invention by applying the radius of curvature R to each of the surfaces of the device as shown in FIG. 3. Therein, a resonant coupler 360 is shown coupling an active gain section 362, a passive section 364 and an intermediate mode transformer section 366. The coupler 360 resonantly couples modes bidirectionally between an active waveguide 368 and a passive waveguide 370. According to an exemplary embodiment of the present invention, the active gain section 362 can have a ridge width of approximately 2.5 µm, while the top waveguide 371 in the passive section can have a ridge width of about 0.3 µm The intermediate mode transformer 366 can have a length of about 100 µm The lengths and widths associated with the tapered mode transformer section 366, i.e., $W_P$, $W_C$, and $W_t$, are selected to optimize coupling between the modes present in the active waveguide 368 and passive waveguide 370, i.e., to create a taper that results in a phase matching condition occurring within the coupling length of the tapered region. The resulting optical mode is asymmetrical in the transverse cross-sectional plane as compared with other mode transformers wherein the optical mode is typically symmetrical. Those readers interested in more details regarding tapering selection and layering structures of exemplary devices such as those illustrated in FIG. 3 are referred again to the above-incorporated by reference U.S. Pat. No. 6,310,995. For the purposes of the present invention, these types of mode transformers have the useful characteristic of being able to transform the mode of the optical energy from a more elliptical mode to a more circular mode using a curved geometry because the active region 362 of these devices is generally shorter than that found in other types of adiabatic mode transformers, thereby reducing the losses associated with introducing the curvature R.

Figure 4:
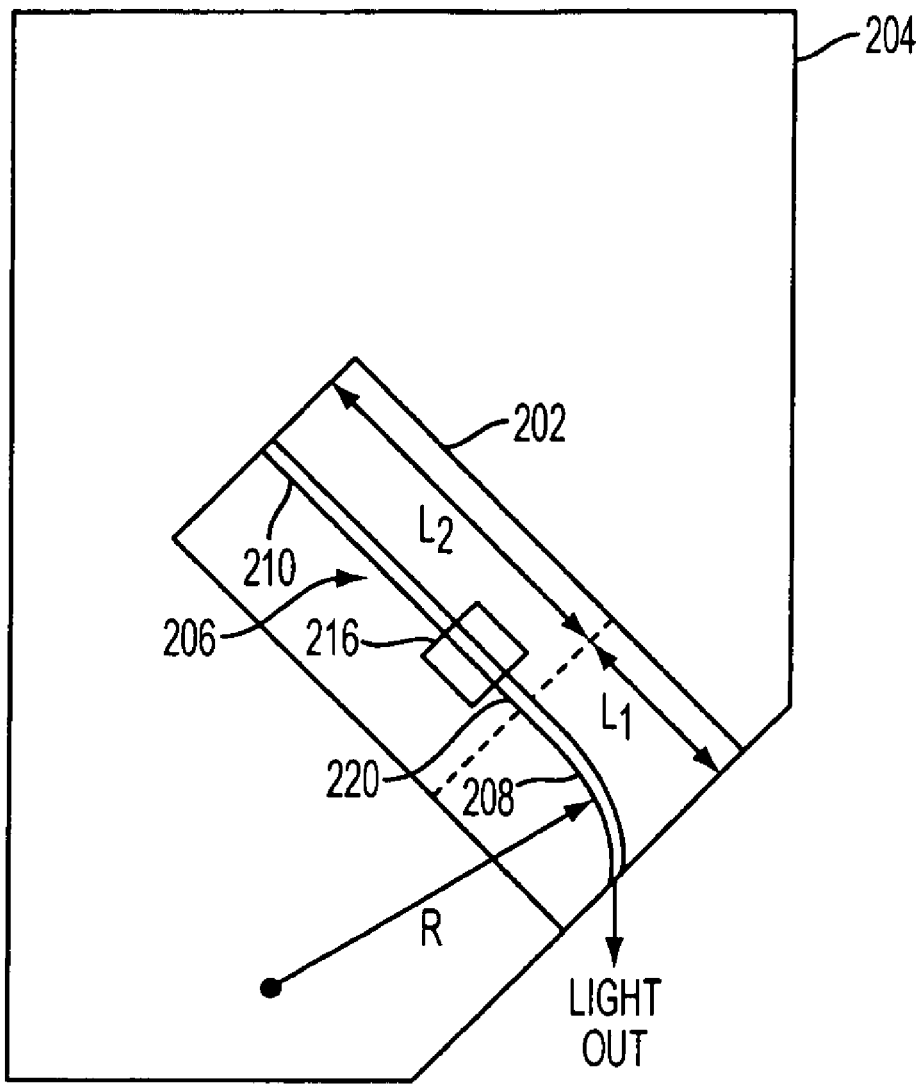
FIG. 4 shows the placement of a mode transformer relative to a curved waveguide according to an exemplary embodiment of the present invention.

It may be desirable to fabricate gain chips 202 which are relatively short. As the size of the gain chip 202 shrinks, the amount of curvature associated with the curved portion 208 of waveguide 206 increases, i.e., R decreases with $L_1$. As the curvature increases, so too do the losses introduced in the curved waveguide 208. At some chip length, the magnitude of these losses may be deemed unacceptable even if the type of mode transformer 216 is specifically selected to minimize these types of losses as described above with respect to FIGS. 2 and 3. Therefore, according to another exemplary embodiment of the present invention which is illustrated in FIG. 4, the mode transformer 216 can be disposed along the straight portion of the waveguide 206 as opposed to the curved portion 208. In this way, the active region of the mode transformer 216 can be fabricated with a linear geometry to avoid the losses introduced by curvature. The curved portion 208 will then, in this exemplary embodiment, be a passive waveguide that is designed to support both a circular beam and the smaller radius of curvature R that is associated with the shorter gain chip 202. For a passive waveguide, a more strongly confined mode can be supported in comparison with the active waveguide, leading to lower losses in the curved section of the waveguide and, consequently, to lower overall optical loss on the chip. Since the mode transformer 216 possesses a straight, or substantially straight, geometry in this exemplary embodiment, the selection of the type of mode transformer used in this embodiment need not be based on its ability to mitigate losses in the active region associated with curvature. Thus any of the aforedescribed mode transformers, and other types, maybe employed as mode transformer 216 in the exemplary embodiment of FIG. 4 as long as they are consistent with the short chip length Note that the mode tranformer 216 may or may not abut the curved portion 208 of the waveguide 206. For reasons described below with respect to FIG. 6, it may be desirable to provide a straight passive portion 220 of the waveguide 206 between the mode transformer 216 and the curved passive portion 208 as seen in FIG. 4.

Figure 5:
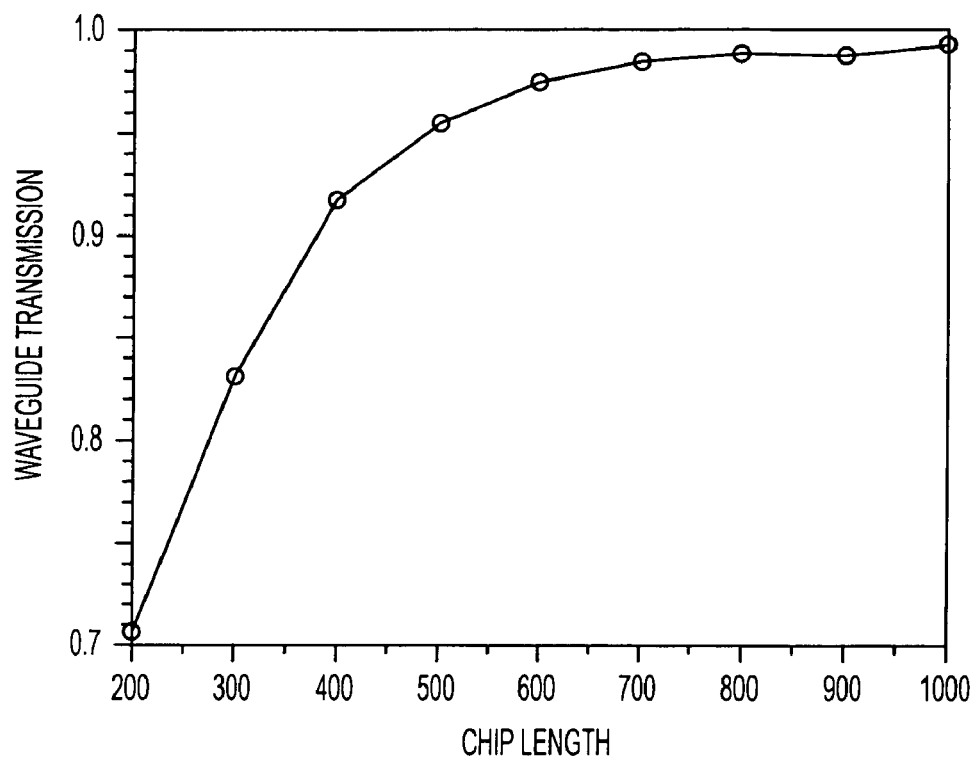
FIG. 5 is a graph depicting optical radiation loss as a function of chip length for an exemplary single angled facet device.

The choice of whether to implement the mode transformer 216 along the curved portion 208 or the straight portion 210 of the waveguide 206 will vary depending upon the desired gain chip implementation. One consideration in making this choice is that, for the same gain chip length, the length of the active region 210 of the waveguide 206 is shorter in the exemplary embodiment of FIG. 4 as compared with the exemplary embodiment of FIG. 2 due to the longer passive section 208, 220 in the former emdodiment. In some applications it may be desirable to maximize the length of the active region, making the embodiment of FIG. 2 more desirable. As mentioned earlier, another consideration is the chip length and corresponding radius of curvature of the curved portion of the waveguide. To better understand this phenomenon, Applicants have simulated the relationship between gain chip length and radiation losses for an exemplary single angled facet gain chip having a $\theta$ value of 8 degrees, resulting in the graph of FIG. 5. In this case the length of the curved portion of the waveguide is equal to the total chip length ($L=L_1$), that is, there is no straight portion ($L_2=0$). Therein, it can be seen that radiation losses due to increased curvature in the curved portion of the waveguide 206 increase dramatically as the length of the chip falls below about 500 microns. Thus, gain chip designers contemplating whether to fabricate the mode transformer along the straight portion of the waveguide or the curved portion of the waveguide may opt for the former if the chip length is less than 500 microns. Alternatively, if maximizing the length of the active region for a fixed chip length is a more important consideration for a particular implementation, then additional losses may be acceptable and the mode transformer 216 may be implemented along the curved portion 208 of the waveguide 206 if the chip length is greater than, for example, 400 microns.

Figure 6:
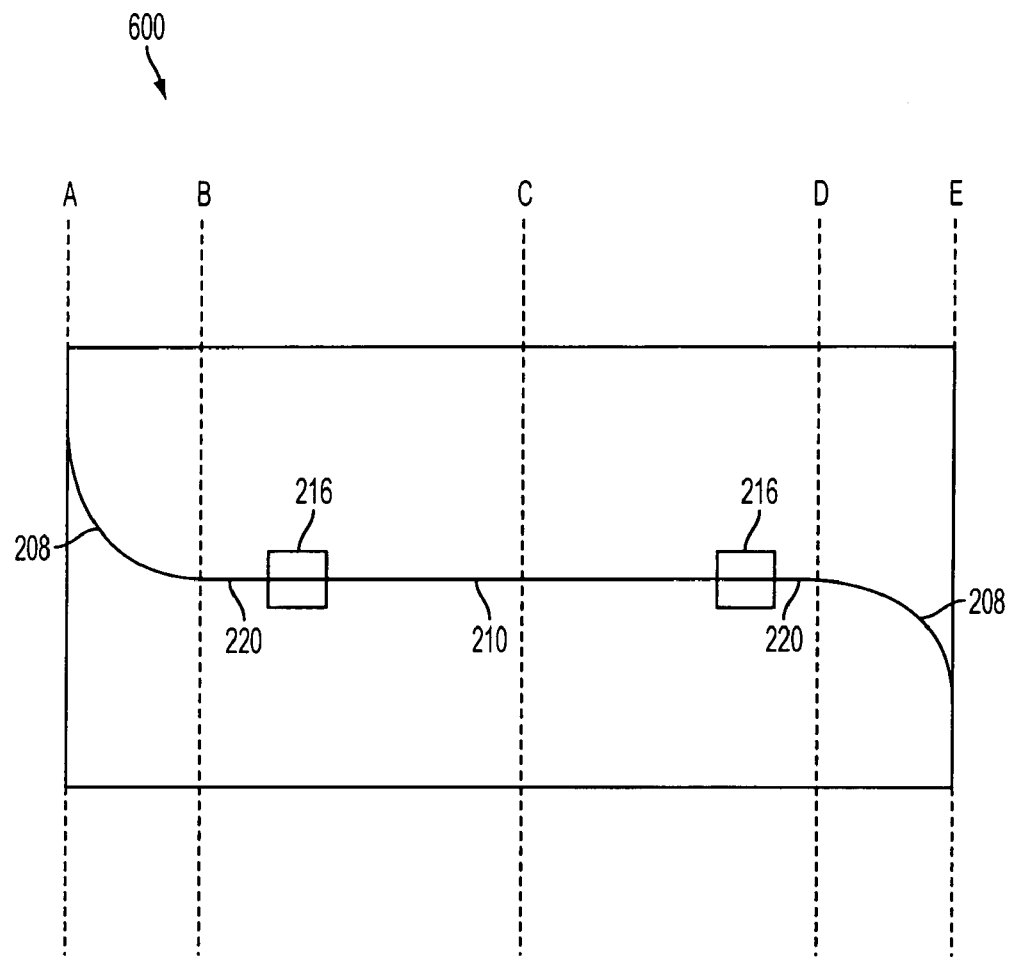
FIG. 6 depicts techniques for cleaving a wafer to obtain different types of semiconductor devices according to exemplary embodiments of the present invention.

In addition to facilitating shorter chip size, the gain chip arrangement of FIG. 4 also confers manufacturing flexibility. Consider the exemplary portion 600 of a semiconductor wafer shown in FIG. 6. Therein, devices are created in reverse orientation relative to one another on the semiconductor wafer, i.e., the curved portions 208 of the waveguides are disposed on opposite sides of the wafer surface. By orienting the mode transformers 216, curved passive portions 208, straight passive portions 220 and straight active portion 210 of the waveguide as illustrated in FIG. 6, the device manufacturer can create different types of devices from the same semiconductor wafer by selecting which line or lines along which to cleave the wafer. For example, if the structure 600 is cleaved along lines A, C and E, then two of the single angled facet gain chips described above with respect to FIG. 4 will be created. Alternatively, if the structure 600 is cut along lines A and E, then one semiconductor optical amplifier (SOA) chip is created. Yet another option is to cleave along lines B, C and D to create two semiconductor laser chips, each having one mode transformer. Lastly, cleaving along lines B and E will result in one SAF device having two mode transformers. This flexibility in device selection from the same structure created on a semiconductor wafer will enable devices according to the present invention to be manufactured more cost effectively. In fact, one skilled in the art may elect to fabricate SAF devices with the embodiment of FIG. 4 that are much longer than 500 um, e.g., up to or exceeding 1500 microns, to take advantage of this manufacturing flexibility.

The above-described exemplary embodiments are intended to be illustrative in all respects, rather than restrictive, of the present invention. Thus the present invention is capable of many variations in detailed implementation that can be derived from the description contained herein by a person skilled in the art. AU such variations and modifications are considered to be within the scope and spirit of the present invention as defined by the following claims. No element, act, or instruction used in the description of the present application should be construed as critical or essential to the invention unless explicitly described as such Also, as used herein, the article "a" is intended to include one or more items.

What is claimed is:

1. A semiconductor device comprising:
   a semiconductor gain medium having a front and back facet;
   a waveguide extending between said front and back facets for conveying optical energy therebetween, said waveguide having at least one curved portion; and
   a mode transformer, disposed on said waveguide along a portion thereof, for transforming a mode profile of said optical energy conveyed by said waveguide from a first mode profile to a second mode profile,
   wherein said mode transformer is formed on a substantially straight portion of said waveguide between said at least one curved portion and said back facet.

2. The semiconductor device of claim 1, wherein said mode profile is substantially elliptical and said second mode profile is substantially circular.

3. The semiconductor device of claim 1, wherein said at least one curved portion has
   a shape which is selected such that said at least one curved portion intersects said front facet at a predetermined angle relative to the normal of the front facet.

4. The semiconductor device of claim 1, wherein said semiconductor device is a gain chip.

5. The semiconductor device of claim 1, wherein said semiconductor device has a length of less than 1500 microns.

6. The semiconductor device of claim 5, wherein said semiconductor device has a length of greater than 400 microns.

7. The semiconductor device of claim 1, wherein said semiconductor device has a length of less than 500 microns.

8. A semiconductor device comprising:
   a semiconductor gain medium having a front and back facet;
   a waveguide extending between said front and back facets for conveying optical energy therebetween, said waveguide having at least one curved portion; and
   a mode transformer, disposed on said waveguide along a portion thereof, for transforming a mode profile of said optical energy conveyed by said waveguide from a first mode profile to a second mode profile, wherein said mode transformer is formed on at least part of said at least one curved portion of said waveguide;

wherein said mode transformer further comprises a resonant coupler having a coupling region with first and second ends, a coupling length and a tapered region, wherein a phase matching condition associated with said first mode profile and said second mode profile is met within the coupling length of the coupling region;

wherein said tapered region of said mode transformer and at least one curved portion of said waveguide are located at different positions within said device.

9. The semiconductor device of claim 8, wherein said semiconductor device has a length of greater than 500 microns.

10. The semiconductor device of claim 9 wherein said semiconductor device has a length of less than 400 microns.

11. A semiconductor device comprising:

optical input means and output means for allowing optical energy to enter and leave said semiconductor device;

semiconductor gain means for providing gain to said optical energy in a lasing cavity;

waveguide means for conveying optical energy between said optical input means and optical output means, said waveguide means having at least one curved portion; and mode transformation means, disposed on said waveguide means, for transforming a mode profile of said optical energy conveyed by said waveguide means, wherein said mode transformation means is formed on a substantially straight portion of said waveguide means between said at least one curved portion and said input means.

12. The semiconductor device of claim 11, wherein said mode transformation means transforms said mode profile from a substantially elliptical mode to a substantially circular mode.

13. The semiconductor device of claim 11, wherein said at least one curved portion has curvature selected such that said at least one curved portion intersects said output means at a predetermined angle relative to the normal of the output means.

14. The semiconductor device of claim 11, wherein said semiconductor device is a gain chip.

15. The semiconductor device of claim 11, wherein said semiconductor device has a length of less than 1500 microns.

16. The semiconductor device of claim 11, wherein said semiconductor device has a length of less than 500 microns.

17. The semiconductor device of claim 16, wherein said semiconductor device has a length of less than 400 microns.

18. A semiconductor device comprising:

optical input means and output means for allowing optical energy to enter and leave said semiconductor device;

semiconductor gain means for providing gain to said optical energy in a lasing cavity;

waveguide means for conveying optical energy between said optical input means and optical output means, said waveguide means having at least one curved portion; and mode transformation means, disposed on said waveguide means, for transforming a mode profile of said optical energy conveyed by said waveguide means, wherein said mode transformation means is formed on at least part of said at least one curved portion of said waveguide;

wherein said mode transformation means further comprises a resonant coupler having a coupling region with first and second ends, a coupling length and a tapered region, wherein a phase matching condition is met within the coupling length of the coupling region;

wherein said tapered region of said mode transformer and at least one curved portion of said waveciuide are located at different positions within said device.

19. The semiconductor device of claim 18, wherein said semiconductor device has a length of greater than 500 microns.

20. The semiconductor device of claim 19, wherein said semiconductor device has a length of greater than 400 microns.

21. A method of using optical energy by a semiconductor device, comprising the steps of:

allowing optical energy to enter and leave said semiconductor device through an optical input and output;

providing gain to said optical energy in a lasing cavity;

conveying said optical energy between said optical input and optical output through a passive waveguide having at least one curved portion; and transforming a mode profile of said optical energy conveyed by said passive waveguide using a mode transformer, said mode transformer being disposed on said passive waveguide, wherein said mode transformer is formed on a substantially straight portion of said waveguide between said at least one curved portion and said back facet.

* * * * *